(12) United States Patent
Abargues et al.

(10) Patent No.: US 7,351,518 B2
(45) Date of Patent: Apr. 1, 2008

(54) COMPOSITION WHICH FORMS AN ELECTRICALLY CONDUCTIVE RESIST LAYER AND A METHOD FOR PATTERNING A PHOTORESIST USING THE RESIST LAYER

(75) Inventors: Rafael Abargues, Erlangen (DE); Klaus Elian, Bubenreuth (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/087,729

(22) Filed: Mar. 23, 2005

(65) Prior Publication Data
US 2005/0250041 A1  Nov. 10, 2005

Related U.S. Application Data

(63) Continuation of application No. PCT/DE03/03161, filed on Sep. 23, 2003.

(30) Foreign Application Priority Data
Sep. 23, 2002  (DE) ................................ 102 44 197

(51) Int. Cl.
G03F 7/00 (2006.01)
G03F 7/004 (2006.01)

(52) U.S. Cl. .................... 430/311; 430/270.1; 430/5

(58) Field of Classification Search ............. 430/270.1, 430/311
See application file for complete search history.

(56) References Cited

U.S. PATENT DOCUMENTS

| | | | |
|---|---|---|---|
| 5,137,799 A * | 8/1992 | Kaempf et al. .......... 430/270.1 |
| 5,186,861 A | 2/1993 | Schellekens et al. |
| 5,188,767 A * | 2/1993 | Yamazaki et al. .......... 252/512 |
| 5,225,495 A * | 7/1993 | Han et al. ................ 525/327.4 |
| 5,306,443 A * | 4/1994 | Kaneko et al. ......... 252/519.33 |
| 5,447,824 A * | 9/1995 | Mutsaers et al. .......... 430/315 |
| 5,561,030 A * | 10/1996 | Holdcroft et al. .......... 430/311 |
| 6,099,757 A * | 8/2000 | Kulkarni .................... 252/500 |
| 6,132,644 A * | 10/2000 | Angelopoulos et al. .... 252/500 |
| 6,511,783 B1 * | 1/2003 | Uenishi ................... 430/270.1 |
| 6,759,083 B2 * | 7/2004 | Lamotte et al. .............. 427/64 |
| 2002/0032271 A1 | 3/2002 | Katashima et al. |

FOREIGN PATENT DOCUMENTS

| | | |
|---|---|---|
| DE | 43 18 076 A1 | 12/1994 |
| EP | 0 442 547 A2 | 8/1991 |
| EP | 0 540 448 A1 | 5/1993 |
| EP | 0 822 236 A1 | 2/1998 |

* cited by examiner

*Primary Examiner*—Amanda Walke
(74) *Attorney, Agent, or Firm*—Slater & Matsil, L.L.P.

(57) ABSTRACT

A composition is specified which forms an electrically conductive resist layer and comprises a resin that can be crosslinked to form a base polymer, an organic compound that can be crosslinked to form an electrically conductive substance, a crosslinking agent having an oxidative or reductive action, and at least one solvent. An electrically conductive resist layer of this type may be used for example for dissipating electrical charges when patterning a photoresist by means of electrically charged particles.

18 Claims, 2 Drawing Sheets

COMPOSITION WHICH FORMS AN ELECTRICALLY CONDUCTIVE RESIST LAYER AND A METHOD FOR PATTERNING A PHOTORESIST USING THE RESIST LAYER

This application is a continuation of co-pending International Application No. PCT/DE03/03161, filed Sep. 23, 2003, which designated the United States and was not published in English, and which is based on German Application No. 102 44 197.9, filed Sep. 23, 2002, both of which applications are incorporated herein by reference.

TECHNICAL FIELD

The present invention relates generally to resist layers, and more particularly to a composition, which forms an electrically conductive resist layer and a method for patterning a photoresist using the resist layer.

BACKGROUND

In semiconductor technology, photoresists situated on a substrate are more and more often being patterned by means of electrically charged particles, for example electrons. In this case, patterning by means of electron beam lithography enables more highly resolved structures than optical lithography techniques. Principally in the fabrication of lithography masks, which generally comprise a quartz glass substrate with an applied patterned metal layer, for example chromium, the structures to be produced in the metal layer and the quartz glass substrate are becoming ever smaller. In this case, the lithography masks have structures that are transferred by means of exposure, e.g., using UV radiation, to a photoresist situated on a semiconductor substrate to be patterned. The fine structures of the lithography masks can be attributed to the fact that so-called OPC structures (optical proximity correction) are often integrated into the masks, the OPC structures being significantly smaller than the structures that are actually to be imaged. The OPC structures comprise, e.g., very small structures that serve to compensate for the modification of the mask structure by the light.

Furthermore, the fabrication of so-called phase shifter masks is particularly demanding since additional layers have to be applied to the mask in this case, or the mask substrate is removed in a defined manner after the patterning of the metal layer in order to achieve, by means of interference, the desired phase jumps during the exposure of a photoresist on a semiconductor substrate.

The fabrication of the phase shifter masks generally requires two separate lithographic patterning steps of photoresists. In the first step, a metal layer, for example chromium, situated on the mask substrate, the quartz glass substrate, is patterned. For this purpose, a photoresist layer is applied to the chromium layer and is patterned by means of an electron beam and subsequently developed. Since a continuous metal layer is present on the mask substrate, the negative electrical charging of the mask that arises can still be dissipated without any problems. The structure present in the photoresist can then be transferred to the chromium layer by means of an oxygen/chlorine plasma, for example. In the fabrication of phase shifter masks, it is subsequently often necessary, moreover, for the quartz glass substrate likewise to be patterned (see, e.g., FIG. 1G). For this purpose, a photoresist is likewise applied to the mask with the prepatterned chromium layer and is subsequently patterned by means of an electron beam. On account of the already prepatterned chromium layer that is no longer present on the entire quartz glass substrate, whole-area dissipation of the charge is no longer possible here, with the result that the quartz glass substrate is negatively charged during the writing operation. This negative charging influences the electron beam that is necessary both for writing and for alignment control. This influencing leads to an undesirable deflection and expansion of the electron beam, which is particularly disturbing during alignment, but also leads to undesirable distortions and errors during the patterning of the photoresist. For this reason, in the second lithography step, the photoresist has often been patterned optically heretofore, but this has the disadvantage that the resolutions are not as high as those that can be achieved in the case of patterning by means of an electron beam.

SUMMARY OF THE INVENTION

Therefore, it is an aim of the present invention to specify a composition that forms an electrically conductive resist layer and that can be used, when patterning photoresists by means of electrically charged particles, for dissipating the resulting charge.

This object is achieved by means of a composition, which includes a resin that can be crosslinked to form a base polymer, an organic compound that can be crosslinked to form an electrically conductive substance, a crosslinking agent having an oxidative or reductive effect, and at least one solvent. An advantageous refinement of the composition and a method for patterning a photoresist using the resist layer are also disclosed.

By crosslinking the composition, it is possible to form an electrically conductive resist layer, which is particularly stable and inert with respect to customary aqueous developer systems of photoresists. At the same time, the electrically conductive resist layer has a sufficiently high conductivity in the range of e.g., $10^{-4}$ to $10^{-1}$ S/cm$^2$, which enables a very good dissipation of the electrical charges. Moreover, the electrically conductive resist layer can be etched particularly well by means of reactive plasmas, for example an oxygen plasma.

A further advantage of the resist layer formed by the composition according to the invention consists in the fact that it can be produced with a particle size of <0.2 μm. Structures having a high resolution can therefore be realized in this resist layer. The particle size of a layer generally limits the resolution of the structures that can be introduced into the layer. Many electrically conductive polymers, e.g., polyacetylenes, have very large particle sizes of >0.5 μm, with the result that they cannot be patterned with a high resolution.

The resin is advantageously thermally crosslinkable, which is the case for example with so-called self-crosslinking resins. Examples of appropriate self-crosslinking resins are phenol-formaldehyde resins, for example novolak or cresol. These have the advantage that they are also a constituent of conventional chemically amplified photoresists (CA resists), with the result that the electrically conductive resist layer has particularly good chemical compatibility with photoresists that are possibly to be applied on the resist layer.

The organic compound is expediently oxidatively crosslinkable, the crosslinking agent then being an oxidizing agent. The organic compound may be selected from low molecular weight organic compounds having at least 6 conjugated π electrons and electrically conductive polymers.

The organic compound may be selected from the classes of compounds pyrroles, furans, thiophenes, anilines, naphthalenes, anthracenes and vinylidenes, it being possible for the aforementioned parent structures to be substituted as desired in each case. Vinylidenes are to be understood as aliphatic organic compounds having conjugated double bonds.

The organic compound is particularly advantageously selected from pyrrole, hexylthiophene, furan, thiophene, bithiophene, EDOT (3,4-ethylenedioxythiophene) and terthiophene. These compounds constitute so-called intrinsically conductive compounds, which are nonconductive as monomers or oligomers and can be converted into electrically conductive compounds by means of oxidative polymerization (crosslinking). It is also possible to use short-chain polymers which can subsequently be converted into longer-chain polymers by means of oxidative polymerization.

Iron(III) chloride and copper perchlorate $Cu(ClO_4)_2$ can be used particularly well as oxidatively effective crosslinking agents. However, the crosslinking agent may also be selected from other, including organic, oxidizing agents.

Crosslinking in the sense of the invention is in this case understood to mean crosslinking of macromolecules, e.g., individual resin molecules, with one another to form three-dimensional networks and also polymerizations, that is to say conversions of low molecular weight compounds into high molecular weight compounds.

In principle, it is also possible to use intrinsically conductive compounds, which can be converted into electrically conductive organic compounds by means of reductive crosslinking. In these cases, the crosslinking agent is advantageously a reducing agent.

The solvent is expediently selected from the solvents methoxypropyl acetate, ethyl lactate, ethyl acetate, cyclohexanone, cyclopentanone, gamma-butyrolactone, hexanol, tetrahydrofuran, methanol and acetontrile. These solvents, and also the mixtures thereof, are particularly well suited to dissolving the resin that can be crosslinked to form a base polymer, the organic compound that can be crosslinked to form an electrically conductive substance, and the crosslinking agent, and thus to creating highly concentrated compositions that are suitably viscous for a coating.

When a composition according to the invention is crosslinked, in this case not only are covalent bonds linked between individual molecules of the resin or individual molecules of the organic compound that can be crosslinked to form an electrically conductive substance, but also covalent bonds are formed between the base polymer and the electrically conductive organic compound. This has the advantage that an electrically conductive resist layer that is inert particularly well with respect to chemical solvents and is constructed by means of a branched molecular framework is formed during the crosslinking. If the resin is novolak, for example, then the aromatic OH groups can react with further OH groups of novolak oligomers, reactions of the OH group with the aromatic rings of organic compound, e.g. thiophene, also being possible.

A composition according to the invention advantageously further comprises a crosslinker. This compound can additionally crosslink during the crosslinking of the composition with individual molecules of the resin and thus form further covalent bonds. A reaction of the crosslinker with the organic compound that can be crosslinked to form an electrically conductive substance is also possible.

Organic compounds having more than two crosslinkable functional groups, e.g., OH groups or amino groups, can be used particularly well as crosslinkers. Alkylolmelamine compounds, e.g., methylolmelamine compounds such as hexamethylolmelamine, are used, by way of example. It is also possible to use tetraalkyl acetals, e.g., the tetramethyl acetal of terephthalaldehyde.

The resin is advantageously present in the overall composition in a proportion of 2 to 20% by weight. The organic compound is present in the overall composition in a proportion of 0.5 to 10% by weight and the crosslinking agent is present in the overall composition in a proportion of 0.5 to 10% by weight. The solvent, may make up between 40 and 95% by weight of the overall composition.

A particularly advantageous composition according to the invention has novolak as a resin, methylolmelamine as a crosslinker, terthiophene as an organic compound, copper perchlorate as a crosslinking agent, and methoxypropyl acetate as a solvent.

Another variant of a composition according to the invention has approximately 4.9% by weight of novolak as resin, approximately 1% by weight of terthiophene as an organic compound, approximately 49.5% by weight of an approximately 4-percent strength iron chloride solution in tetrahydrofuran as a crosslinking agent, and approximately 55.4% by weight of methoxypropyl acetate as a solvent.

The invention furthermore relates to a method for patterning a photoresist layer using the electrically conductive resist layer formed from the composition according to the invention. A composition according to the invention is applied to a substrate. The composition is then crosslinked, an electrically conductive resist layer being produced. A patternable photoresist layer is subsequently produced on the resist layer. Afterward, structures can be produced in the photoresist layer by means of electrically charged particles with electrical charge being dissipated via the resist layer.

In this case, the electrically charged particles may be electrons, protons or alpha particles, for example. The advantage of the method according to the invention lies in the fact that the electrically conductive resist layer dissipates the electrical charge particularly well, so that the photoresist layer situated on the electrically conductive resist layer can be patterned by means of the electrically charged particles with a particularly good resolution. During the production of the structures, the substrate is also grounded, e.g., by means of a so-called x-y table in mask writers. Since conventional photoresist layers are generally developed by means of aqueous, for example alkaline developers, a further advantage of the method according to the invention consists in the fact that the electrically conductive resist layer formed from the composition according to the invention is not soluble in aqueous developers, so that the photoresist structures cannot be flushed from underneath, which can possibly even lead to complete flushing away in the case of very fine structures. Furthermore, the resist layers according to the invention are compatible particularly well with conventional photoresists.

In a further refinement of the method according to the invention, the structures in the photoresist layer may be transferred to the substrate through the resist layer. This may be done for example by means of an oxygen plasma and/or a fluorine-containing plasma. A photomask, for example made of quartz glass, can be used for example as the substrate. It is furthermore possible for a photomask on which a patterned metal layer is at least partly arranged to be used as the substrate. As already mentioned above, in this case the electrically conductive resist layer according to the invention may particularly advantageously enable a particularly good dissipation of charge despite the interruption of the patterned metal layer.

The composition is advantageously heated for the crosslinking. This makes it possible in a particularly simple manner, in interaction with the crosslinking agent, for the resin and organic compound to be simultaneously interlinked.

The photoresist layer may be patterned by means of an electron beam.

In a further method step, both the photoresist and the electrically conductive resist layer may be removed, the patterned substrate being uncovered.

DESCRIPTION OF THE DRAWINGS

The invention will be explained in more detail below with reference to figures and exemplary embodiments.

DETAILED DESCRIPTION OF ILLUSTRATIVE EMBODIMENTS

Figure 1A:
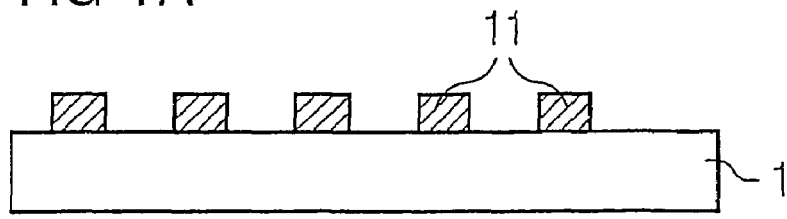
FIGS. 1A to 1G show a variant of a method according to the invention.

A substrate 1 with a patterned metal layer 11 applied thereon can be seen in cross section in FIG. 1A. In the case of a method for fabricating photomasks, the substrate 1 is composed of quartz glass, for example, and the patterned metal layer is composed of chromium, for example.

Figure 1B:
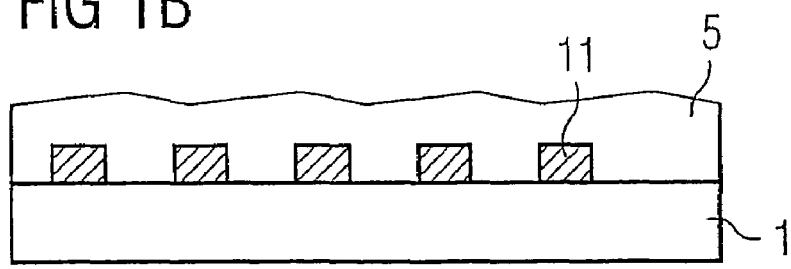

FIG. 1B shows a first method step of the method according to the invention in cross section. In this case, the composition 5 according to the invention is applied to the substrate. This may be effected by means of spincoating, for example.

Figure 1C:
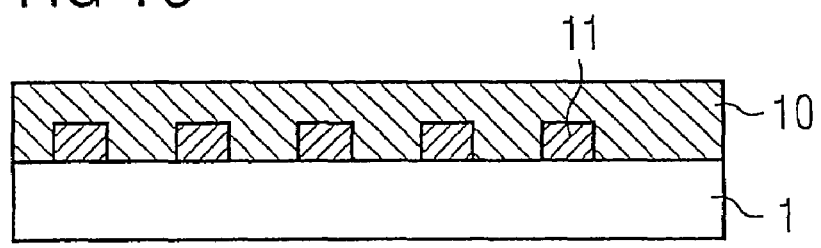

FIG. 1C shows a cross section of the arrangement on the substrate after the composition is crosslinked according to the invention. The composition 5 was able to be produced as a planar layer on the substrate by means of spincoating and be crosslinked, e.g., by means of thermal heating, with the result that the electrically conductive resist layer 10 was produced on the substrate 1 and the patterned metal layer 11.

Figure 1D:
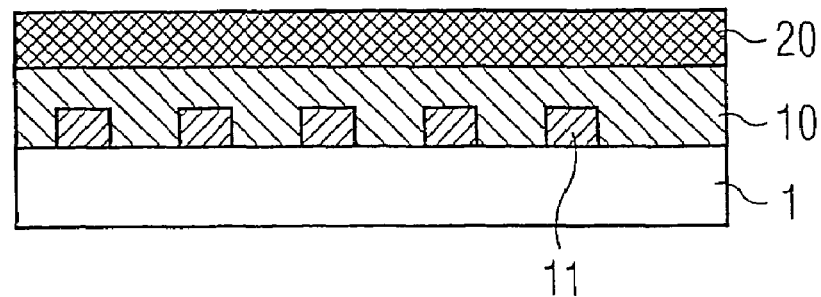

FIG. 1D shows the arrangement on the substrate after another method step of the method according to the invention. In this case, a photoresist layer 20 has been produced on the electrically conductive resist layer 10 by means of conventional methods. A photoresist that can be patterned by means of electron beams may be involved in this case, by way of example.

Figure 1E:
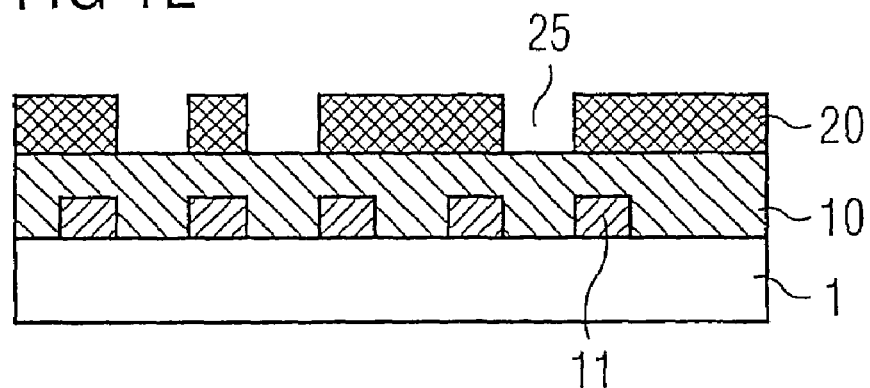

FIG. 1E shows the arrangement after the patterning of the photoresist layer 20 by means of electrically charged particles, for example electrons. In this case, structures 25 were produced in the photoresist layer. The structures have no distortions since the electrical charge of the substrate 1 was able to be dissipated particularly well via the electrically conductive resist layer 10.

Figure 1F:
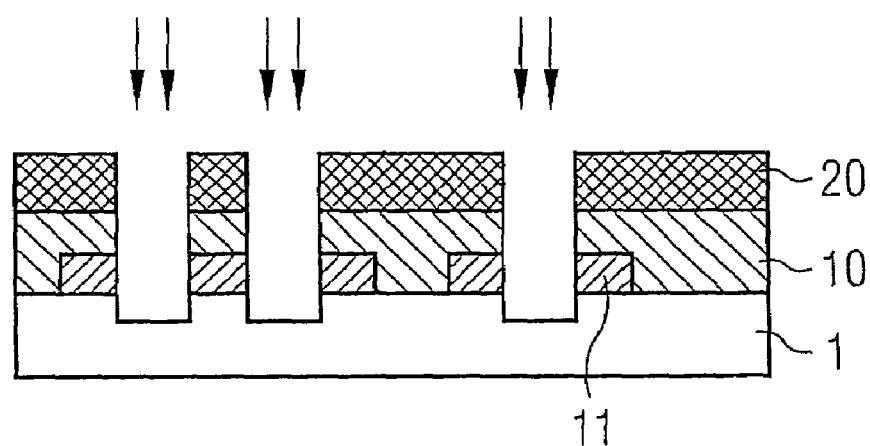

FIG. 1F shows an additional method step of the method according to the invention, in which, by way of example, the structures 25 present in the photoresist layer are transferred to the substrate 1 through the resist layer 10 by means of a dry plasma etching method.

Figure 1G:
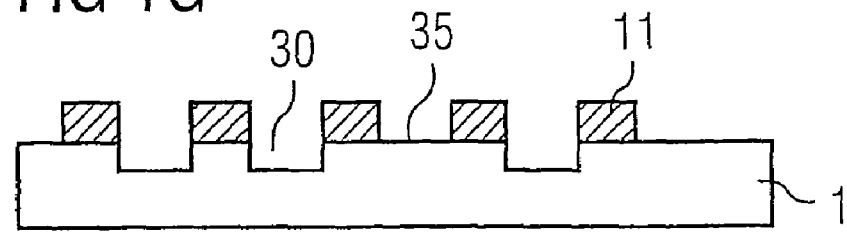

FIG. 1G shows, in cross section, the arrangement after removal of the photoresist layer and the electrically conductive resist layer. In the case of a photomask in which the substrate 1 is quartz glass, for example, and the patterned metal layer 11 is chromium, for example, a phase shifter mask was fabricated. In this case, those regions on which the chromium is arranged are not transmissive to the light used in the lithographic patterning of a semiconductor. Regions 35 in which the quartz glass substrate was not etched are transmissive to the light, no phase shift taking place. Regions 30 of the quartz glass substrate which were etched are likewise transmissive to the light, but cause a phase shift.

Exemplary Embodiment 1

A composition according to the invention is prepared by admixing 1 g of terthiophene (an organic compound) from the company Aldrich, with 49.5 g of the novolak solution BLC-001 (a resin) from the company Tokyo Ohka and then 49.5 g of a 4-percent strength solution of anhydrous iron(III) chloride in tetrahydrofuran (crossing agent and solvent) are added thereto. The composition obtained is intimately mixed on a shaking device for 30 minutes.

The composition according to the invention is applied on a 4" silicon test wafer by means of spincoating (4000 rpm 20 seconds). The electrically conductive resist layer is subsequently formed by crosslinking. For this purpose, the composition is heated at 160° C. for 120 seconds. A large part of the solvent evaporates in the process, resulting in a dry, electrically conductive, dark-gray, transparent resist film having a layer thickness of 0.5 μm on the silicon test wafer.

The electrically conductive resist layer is subsequently coated with a conventional electron-beam-patternable photoresist, for example CAP 209 from Tokyo Ohka. The patternable photoresist is subsequently patterned by means of an electron beam mask writer, for example from ETEC MEBES series.

The structures present in latent fashion in the photoresist layer are subsequently fixed in a heating step for example at approximately 130° C. for approximately 90 seconds (post exposure bake). The photoresist layer is subsequently developed with an aqueous alkaline developer solution, for example approximately 2.38% tetramethylammonium hydroxide in water for approximately 60 seconds. The exposed region of the photoresist is removed in the process. The structures present in the photoresist can subsequently be transferred into the electrically conductive resist layer by means of plasma etching using an oxygen plasma, for example.

Exemplary Embodiment 2

The method is carried out analogously to exemplary embodiment 1; as the composition according to the invention, 1 g of terthiophene is admixed with 49.5 g of novolak solution BLC-001 from Tokyo Ohka and 49.5 g of a 4-percent strength solution of copper perchlorate hexahydrate in tetrahydrofuran are then added.

Exemplary Embodiment 3

The method is carried out analogously to exemplary embodiments 1 and 2; as the composition according to the invention, 1 g of terthiophene is admixed with 49.5 g of a cresol-novolak solution from Clariant. Then, 49.5 g of a 4-percent strength solution of copper perchlorate hexahydrate in methoxypropyl acetate are added thereto and the composition obtained is intimately mixed on a shaking device for 30 minutes.

The invention is not restricted to the exemplary embodiments presented here. Variations are possible primarily in the case of the organic compound and crosslinking agent

What is claimed is:

1. A method for manufacturing a lithography mask, the method comprising:

patterning a first electrically conducting material layer disposed over a substrate, applying a composition over the patterned first electrically conducting material layer, the composition comprising the following components:
- a resin that can be crosslinked to form a base polymer by thermal treatment, which is not patternable by electrically charged particles;
- an organic compound, initially nonconductive, that can be crosslinked to form a second electrically conductive substance by reaction with a crosslinking agent;
- a crosslinking agent having an oxidative or reductive effect; and
- at least one solvent;

crosslinking the composition thereby producing a electrically conductive resist layer;

forming a photoresist layer that can be patterned by means of electrically charged particles, the photoresist layer being formed on the electrically conductive resist layer; and producing structures in the photoresist layer by means of electrically charged particles with electrical charge being dissipated via the resist layer, wherein no structures are formed in the electrically conductive resist layer while producing the structures in the photoresist layer.

2. The method as claimed in claim 1, wherein the resin comprises a phenol-formaldehyde resin.

3. The method as claimed in claim 1, further comprising a crosslinker.

4. The method as claimed in claim 3, wherein the crosslinker is selected from the group consisting of alkylolmelamines and tetraalkyl acetals.

5. The method as claimed in claim 1, wherein the organic compound is oxidatively crosslinkable, and wherein the crosslinking agent comprises an oxidizing agent.

6. The method as claimed in claim 1, wherein the resin comprises at least one organic compound selected from the group consisting of novolak and cresol.

7. The method as claimed in claim 1, wherein the organic compound comprises a compound selected from the group consisting of a low molecular weight organic compound having at least six conjugated π electrons and electrically conductive polymers.

8. The method as claimed in claim 1, wherein the organic compound comprises at least one compound of the class of compounds selected from the group consisting of pyrroles, furans, thiophenes, anilines, naphthalenes, anthracenes and vinylidenes, it being possible for the aforementioned parent structures to be substituted in each case.

9. The method as claimed in claim 1, wherein the organic compound comprises at least one compound selected from the group consisting of pyrrole, hexylthiophene, furan, thiophene, bithiophene, EDOT and terthiophene.

10. The method as claimed in claim 1, wherein the crosslinking agent comprises an oxidizing agent selected from the group consisting of $FeCl_3$ and $Cu(ClO_4)_2$.

11. The method as claimed in claim 1, wherein the solvent comprises at lest one solvent selected from the group consisting of methoxypropyl acetate, ethyl lactate, ethyl acetate, cyclohexanone, cyclopentanone, γ-butyrolactone, hexanol, tetrahydrofuran, methanol and acetontrile.

12. The method as claimed in claim 1, wherein the resin is present in the overall composition in a proportion of 2-20% by weight.

13. The method as claimed in claim 1, wherein the organic compound is present in the overall composition in a proportion of 0.5-10% by weight.

14. The method as claimed in claim 1, wherein the crosslinking agent is present in the overall composition in a proportion of 0.5-10% by weight.

15. The method as claimed in claim 1, wherein the solvent is present in the overall composition in a proportion of 40-95% by weight.

16. The method as claimed in claim 1, wherein:
the resin comprises cresol and novolak;
the organic compound comprises terthiophene;
the crosslinking agent comprises $Cu(ClO_4)_2$; and
the solvent comprises methoxypropyl acetate.

17. The method of claim 1, wherein the first electrically conducting material comprises metal.

18. A method for patterning a photoresist layer, the method comprising:
applying a composition to a substrate, the composition comprising:
- a resin that can be crosslinked to form a base polymer, which is not patternable by electrically charged particles and which is insoluble in aqueous developers;
- an organic compound that can be crosslinked to form an electrically conductive substance;
- a crosslinking agent having an oxidative or reductive action; and
- at least one solvent;

crosslinking the composition thereby producing an electrically conductive resist layer, which is not patternable by electrically charged particles and which is insoluble in aqueous developers;

forming a photoresist layer that can be patterned by means of electrically charged particles, the photoresist layer being formed on the electrically conductive resist layer; and producing structures in the photoresist layer by means of electrically charged particles with electrical charge being dissipated via the resist layer, wherein no structures are formed in the electrically conductive resist layer while producing the structures in the photoresist layer developing the produced structures in the photoresist layer using an aqueous developer, wherein the electrically conductive resist layer is not dissolved by the aqueous developer.

* * * * *

UNITED STATES PATENT AND TRADEMARK OFFICE
CERTIFICATE OF CORRECTION

PATENT NO. : 7,351,518 B2
APPLICATION NO. : 11/087729
DATED : April 1, 2008
INVENTOR(S) : Abargues et al.

It is certified that error appears in the above-identified patent and that said Letters Patent is hereby corrected as shown below:

In Col. 2, line 29, delete "effect" and insert --action--.
In Col. 3, line 59, before comprises, delete "further".
In Col. 3, line 59, after crosslinker, insert --as the resin--.
In Col. 4, line 13, delete "as a resin," and insert --and--.
In Col. 4, lines 13 and 14, delete "a crosslinker" and insert --resins--.
In Col. 6, line 62, after agent, insert --.--.
In Col. 7, line 57, delete "lest" and insert --least--.

Signed and Sealed this

Seventeenth Day of June, 2008

JON W. DUDAS
*Director of the United States Patent and Trademark Office*